US006984590B2

(12) United States Patent
Han et al.

(10) Patent No.: US 6,984,590 B2
(45) Date of Patent: Jan. 10, 2006

(54) METHOD OF MANUFACTURING AN EEPROM DEVICE

(75) Inventors: Chang Hun Han, Icheon-Si (KR); Dong Oog Kim, Seoul (KR)

(73) Assignee: Dongbu Anam Semiconductor Inc., Seoul (KR)

( * ) Notice: Subject to any disclaimer, the term of this patent is extended or adjusted under 35 U.S.C. 154(b) by 119 days.

(21) Appl. No.: 10/743,483

(22) Filed: Dec. 22, 2003

(65) Prior Publication Data

US 2004/0137674 A1 Jul. 15, 2004

(30) Foreign Application Priority Data

Dec. 30, 2002 (KR) ...................... 10-2002-0086916

(51) Int. Cl.
*H01L 21/20* (2006.01)
*H01L 21/265* (2006.01)

(52) U.S. Cl. ...................... 438/766; 438/264; 438/529; 438/530; 438/546; 438/770

(58) Field of Classification Search ................ 438/264, 438/529, 530, 546, 766, 770
See application file for complete search history.

(56) References Cited

U.S. PATENT DOCUMENTS 4,590,665 A * 5/1986 Owens et al. ............... 438/257
5,208,173 A * 5/1993 Yamada et al. ............. 438/264
5,538,923 A 7/1996 Gardner et al. ............. 438/766
6,555,484 B1 * 4/2003 Ramkumar et al. ......... 438/766

FOREIGN PATENT DOCUMENTS

EP 0 690 487 A1 3/1996
JP 2001217329 8/2001

* cited by examiner

*Primary Examiner*—B. William Baumeister
*Assistant Examiner*—Steven J. Fulk
(74) *Attorney, Agent, or Firm*—Hanley, Flight & Zimmerman

(57) ABSTRACT

A method of manufacturing an EEPROM device is disclosed. An example method forms a screen oxide film on a semiconductor substrate, forms a first ion implantation mask defining a gate insulating film forming region on the screen oxide film, and performs a first ion implantation on the semiconductor substrate and the first ion implantation mask. The example method also performs a first annealing of the semiconductor substrate, removes the screen oxide film and the first ion implantation mask, and forms a gate oxide film on the semiconductor substrate. In addition, the example method forms a second ion implantation mask defining a gate insulating film forming region on the gate oxide film, performs a second ion implantation on the semiconductor substrate and the second ion implantation mask, performs a second annealing for the semiconductor substrate, removes the second ion implantation mask; and forms a tunnel oxide film on the gate oxide film.

8 Claims, 4 Drawing Sheets

METHOD OF MANUFACTURING AN EEPROM DEVICE

RELATED APPLICATION

This application is related to Korean Patent Application No. 10-2002-0086916 filed on Dec. 30, 2002, which is incorporated herein by reference in its entirety.

FIELD OF THE DISCLOSURE

The present disclosure relates generally to semiconductor devices and, more particularly, to a method of manufacturing an electrically erasable programmable read only memory device in which a growth of a gate oxide film and a tunnel oxide film occur at the same speed, regardless of whether impurity ions are implanted in a substrate fabricating the same.

BACKGROUND

Semiconductor memory devices include volatile memory devices that lose their data when their power is turned off and non-volatile memory devices, which retain data when their power is turned off. Non-volatile memory devices may be classified as read only memory (ROM) devices, on which stored data is permanent and cannot be modified once the device is fabricated. Another type of non-volatile memory device is an electrically erasable programmable read only memory (EEPROM), which enables data to be programmed on a byte by byte basis. One example of an EEPROM is a flash memory device, on which data may be erased and reprogrammed.

As is known, EEPROM devices are structured to include a source/drain and a gate electrode. The gate electrode has a layered structure including a gate insulating film, a floating gate, a dielectric film and a control gate. The gate insulating film typically consists of a gate oxide film and a tunnel oxide film, which is thinly formed between the floating gate and the drain to enable tunneling of electrons.

During operation, EEPROMs typically provide a program mode in which the floating gate is charged with electrons to put the memory cell in a conducting state. In an erase mode the floating gate is discharged to put the memory cell in a non-conducting state. The program mode is achieved by applying high voltage to the control gate. Electrons are moved from a conduction band of the drain through the thin tunnel oxide film to the floating gate by the applied voltage. The electrons arriving at the floating gate are captured by shutting off the applied voltage. As a result, the electrons accumulated in the floating gate form a P-channel and generate a low threshold voltage. At that time, the tunnel oxide film is not only used as the gate oxide film of the memory cell, but is also used as a potential barrier for the electrons accumulated in the floating gate, thereby exerting a substantial effect upon an electric charge retaining characteristic of the floating gate.

A layout of a conventional EEPROM is described with reference to FIG. 1. As shown in FIG. 1, a plurality of impurity-doped regions used as the source/drain are arranged and spaced apart from each other at regular intervals on a desired portion of a silicon substrate.

On a semiconductor substrate 100 in which an impurity-doped region 101 is not formed, a plurality of control gates 103 are spaced in parallel apart from each other in a horizontal direction, i.e., in a width direction of a channel. A desired shape floating gate having a desired shape is positioned apart from a floating gate 102 of an adjacent cell between the control gate 103 and an upper portion of the substrate in the impurity-doped regions 101 spaced apart from in a vertical direction to the substrate 100, i.e., in a longitudinal direction of a channel.

In production of an EEPROM device, as well as conventional devices, the gate insulating film is formed on the semiconductor substrate comprising the impurity-doped region by a chemical vapor deposition, before forming the floating gate 102 and the control gate 103. Growth speed of the gate insulating film in the impurity-doped region is different from that of the gate insulating film in the region that is not impurity-doped, thereby destabilizing characteristics of the device.

A conventional method of manufacturing the gate insulating film of the EEPROM is described below. First, a screen oxide film is formed on the semiconductor substrate having a device isolating film using a low pressure chemical vapor deposition to protect the semiconductor substrate. At that time, the screen oxide film is deposited in a thickness of 40 to 60 Å under a temperature of 700 to 900° C. In turn, a photoresist film pattern is formed on an upper portion of the screen oxide film to define a gate insulating film forming region, and impurity ions are implanted onto the entire surface of the semiconductor substrate comprising the photoresist film pattern. At that time, impurity ion implantation is performed via a first ion implantation and a second ion implantation. The first ion implantation is performed by implanting 31P ions using a high current ion implanter, wherein the ion implantation energy is 10 to 25 KeV and the ion dose is 3 to $7\times10^{13}$ ion/cm$^2$. Then, the second ion implantation is performed by use of 75As ions, wherein the ion implantation energy is 30 to 50 KeV and the dose is 1 to $3\times10^{13}$ ion/cm$^2$. As a result of performing the impurity ion implantation, the impurity ion is not implanted in the semiconductor substrate in which the photoresist pattern is formed.

After completing the impurity ion implantation, the semiconductor substrate is annealed to induce dispersion of the ions, thereby forming an impurity ion region corresponding to the source/drain region. Then, the photoresist film pattern and the screen oxide are removed.

The gate insulating film is formed with the photoresist film pattern and the screen oxide is removed. The gate insulating film generally consists of a double layer, i.e., a gate oxide film and a tunnel oxide film. The gate oxide film and the tunnel oxide film are sequentially formed to form the gate insulating film.

The gate oxide film is formed to have a thickness of about 200 Å under a temperature of about 800° C. At that time, growth speed of the gate oxide film in the impurity-doped region is different from that of the gate oxide film in the impurity-undoped region (i.e., the region that is not impurity-doped). As shown below in Table 1, which is a result obtained from a test carried out under the above conditions, when the gate oxide film is formed at a temperature of 800° C. using a process time of 32.5 minutes, a gate oxide film of 1364.8 Å is grown in the impurity-doped region, while the gate oxide film of 197.4 Å is grown in the impurity-undoped region. Because the growth speed of the gate oxide film in the impurity-doped region is different from that of the gate oxide film in the impurity-undoped region, imbalanced or different heights result at the formation of device patterns such as a floating gate, a control gate or the like, thereby degrading the reliability of the device.

TABLE 1

| | Growth Thickness(Å) | Process Time(Min) |
|---|---|---|
| Impurity Ion Region | 1364.8 | 32.5 |
| Remaining Region | 197.4 | 32.5 |

DETAILED DESCRIPTION

As described in greater detail below an example method of manufacturing an EEPROM device provides a growth speed of a gate insulating film in an impurity-doped region that is not different from that of the gate insulating film in an impurity-undoped region. More specifically, an example method of manufacturing an EEPROM device includes forming a screen oxide film on a semiconductor substrate, forming a first ion implantation mask defining a gate insulating film forming region on the screen oxide film, performing a first ion implantation onto the semiconductor substrate and the first ion implantation mask, and performing a first annealing for the semiconductor substrate. The example method may also include removing the screen oxide film and the first ion implantation mask, forming a gate oxide film on the semiconductor substrate, forming a second ion implantation mask defining a gate insulating film forming region on the gate oxide film, performing a second ion implantation onto the semiconductor substrate and the second ion implantation mask, performing a second annealing for the semiconductor substrate, removing the second ion implantation mask, and forming a tunnel oxide film on the gate oxide film.

Preferably, the gate oxide film may have a thickness of 50 to 300 Å, the tunnel oxide film may have a thickness of 50 to 100 Å, and the first annealing may be performed at a temperature of 1000 to 1050° C. for 10 to 20 seconds. Also, preferably, the second annealing may be performed at a temperature of 1050 to 1150° C. for 10 to 20 seconds, the first ion implantation may be performed by implanting 31P ions with an ion implantation energy of 50 to 70 KeV and dose of $2\times10^{13}$ to $2\times10^{14}$ ion/cm$^2$, and the second ion implantation may be performed by implanting 75As ions with ion implantation energy of 60 to 85 KeV and dose of $1\times10^{14}$ to $1\times10^{15}$ ion/cm$^2$. In addition, when implementing using the example method described herein, the screen oxide film preferably has a thickness of 40 to 60 Å.

Using the example method described herein, the growth of a gate oxide film and a tunnel oxide film may be made substantially the same, regardless of whether an impurity is implanted in a substrate. The example method may accomplish this by performing ion implantation defining a junction region, i.e., independently performing a first ion implantation of 31P ions and a second ion implantation of 75As ions and then forming a gate oxide film and a tunnel oxide film.

Figure 1:
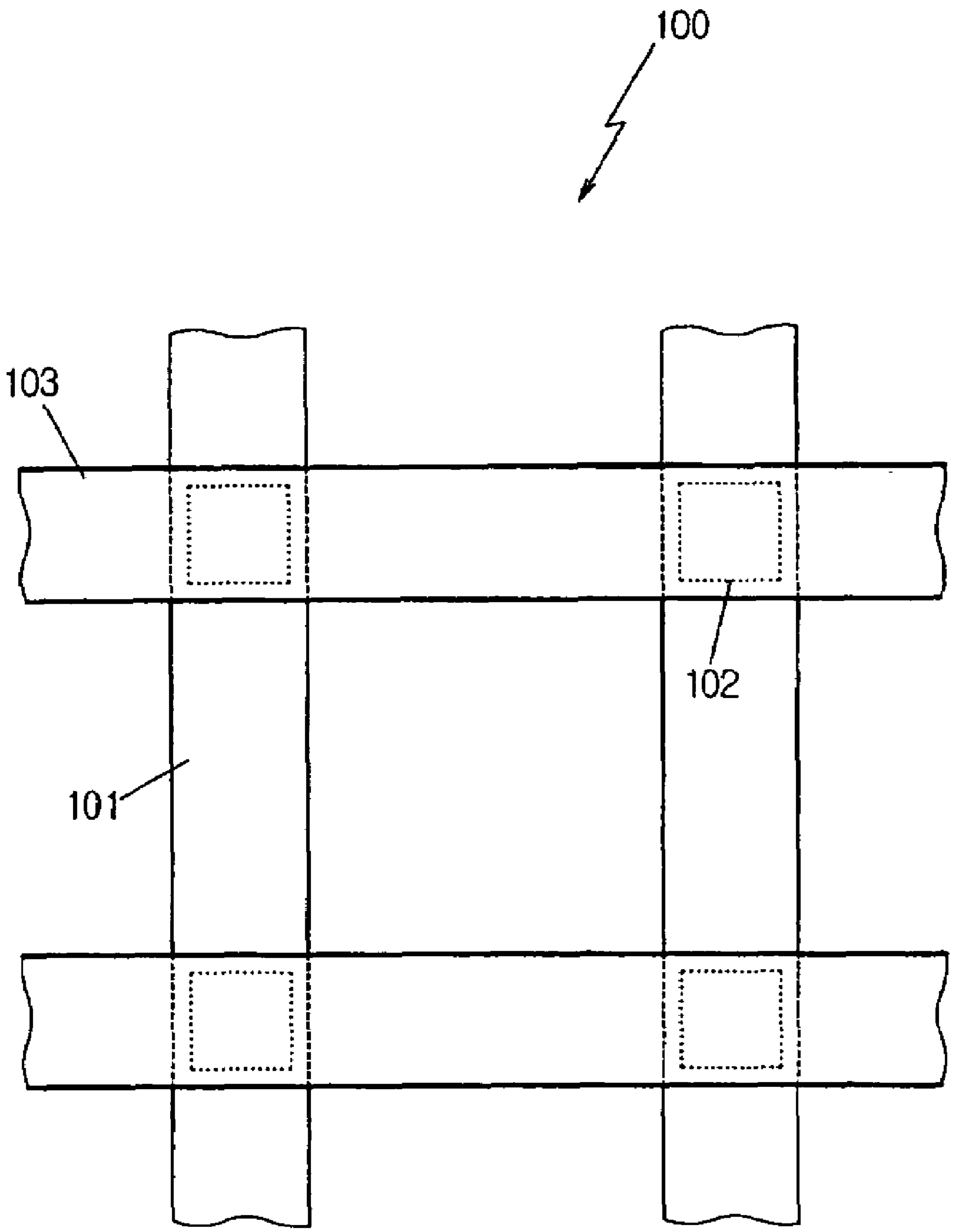
FIG. 1 illustrates a layout of a conventional electrically erasable and programmable read only memory (EEPROM).
Figure 2A:
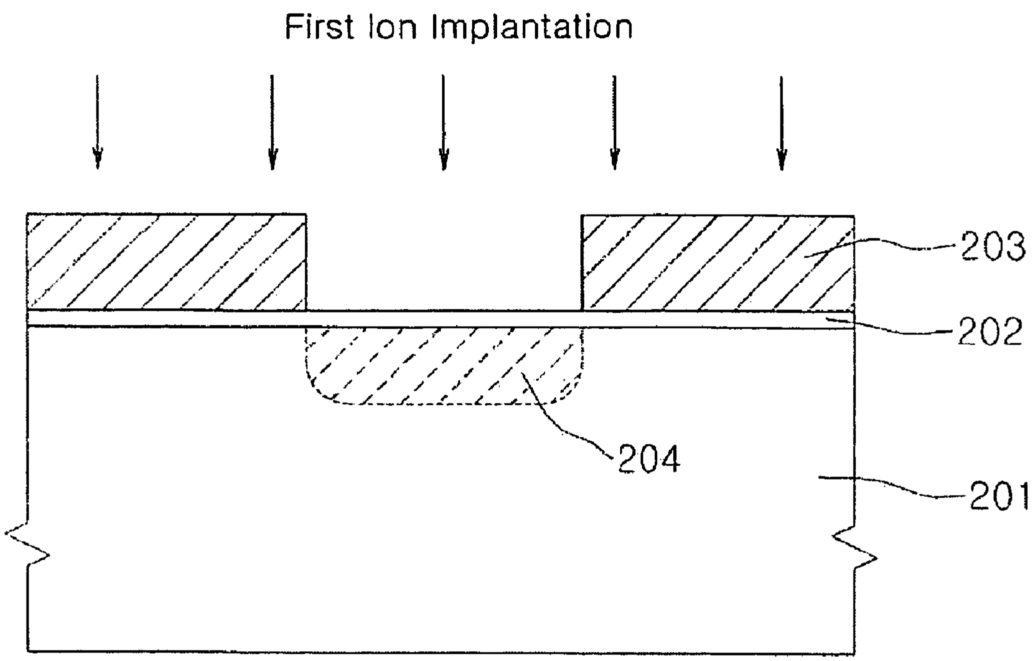
FIGS. 2*a* to 2*c* illustrate an example process of manufacturing an EEPROM.

As shown in FIG. 2*a,* a screen oxide film 202 is formed on a semiconductor substrate 201 having a device isolating film (not shown) by a low pressure chemical vapor deposition or a thermal oxidizing process to protect the semiconductor substrate when performing a subsequent ion implantation. At that time, the screen oxide film 202 is preferably deposited in a thickness of 40 to 60 Å under a temperature of 700 to 900° C.

In turn, a first ion implantation mask 203, e.g., a photoresist film pattern, is formed on the screen oxide film 202 defining a gate insulating film forming region. A first ion implant region 204 is formed in the semiconductor substrate by performing a first ion implantation, in which 31P ions relatively small in volume are implanted into the semiconductor substrate through a high current ion implanter using the photoresist film pattern as an ion implantation mask. In the process of performing the first ion implantation, ion implantation energy is 50 to 70 KeV with an ion dose is $2\times10^{13}$ to $2\times10^{14}$ ion/cm$^2$.

After completing the first ion implantation, a first annealing process is performed for the semiconductor substrate 201 at a temperature of 1000 to 1050° C. for 10 to 20 seconds. Upon completing the first annealing for the semiconductor substrate 201, the screen oxide film 202 and the first ion implantation mask 203 are removed from the semiconductor substrate.

Figure 2B:
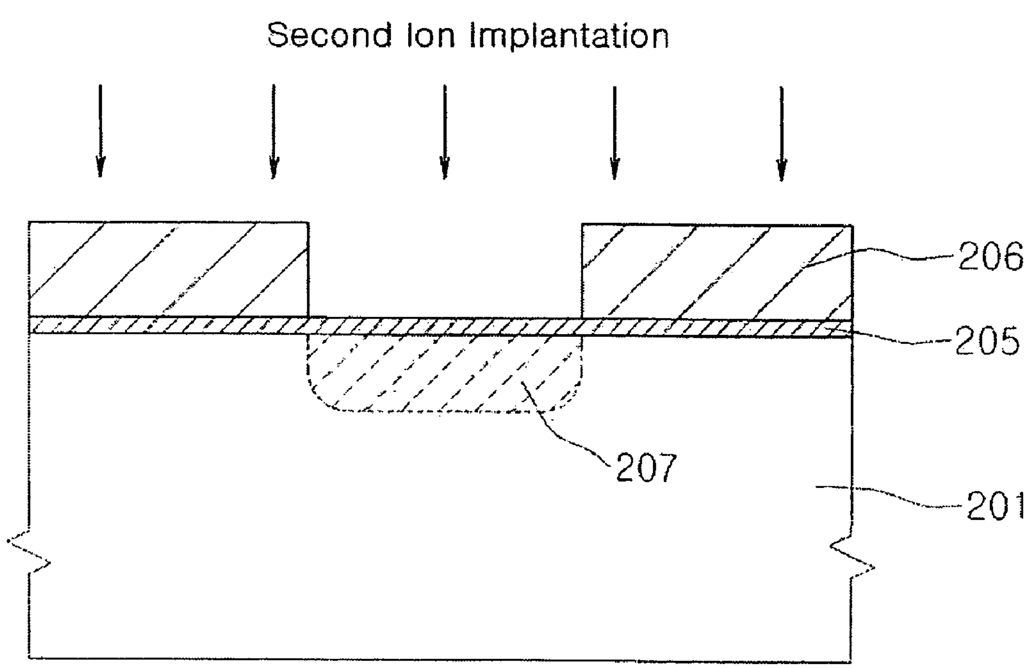

In turn, as shown in FIG. 2*b,* a gate oxide film 205 is formed on the semiconductor substrate. Preferably, the gate oxide film has a thickness of 50 to 300 Å. As shown below in Table 2, which is a result obtained from a test on the gate oxide film formation carried out using the example method described herein, the growth thickness of the gate oxide film in the impurity-doped region is substantially similar to that of the gate oxide film in the impurity-undoped region.

TABLE 2

| | Growth Thickness(Å) | Process Time(Min) |
|---|---|---|
| Impurity ion region | 197.1 | 32.5 |
| Remaining region | 197.4 | 32.5 |

After a gate oxide film 205 is formed on the semiconductor substrate 201, a second ion implantation mask 206 is formed on the gate oxide film 205. The second ion implantation mask utilizes a photoresist film pattern as with the first ion implantation, and also defines a gate insulating film forming region as the first ion implantation mask.

An ion implantation barrier is formed on the gate oxide film, and a second ion implant region 207 is formed in the semiconductor substrate by performing a second ion implantation on the semiconductor substrate and the second ion implantation mask. The second ion implant region corresponds to the first ion implant region. The ions used in the second ion implantation are 75As ions. Preferably, the ion implantation energy is 60 to 85 KeV and the dose of is $1\times10^{14}$ to $1\times10^{15}$ ion/cm$^2$. A second annealing is performed at a temperature of 1050 to 1150° C. for 10 to 20 seconds.

Figure 2C:
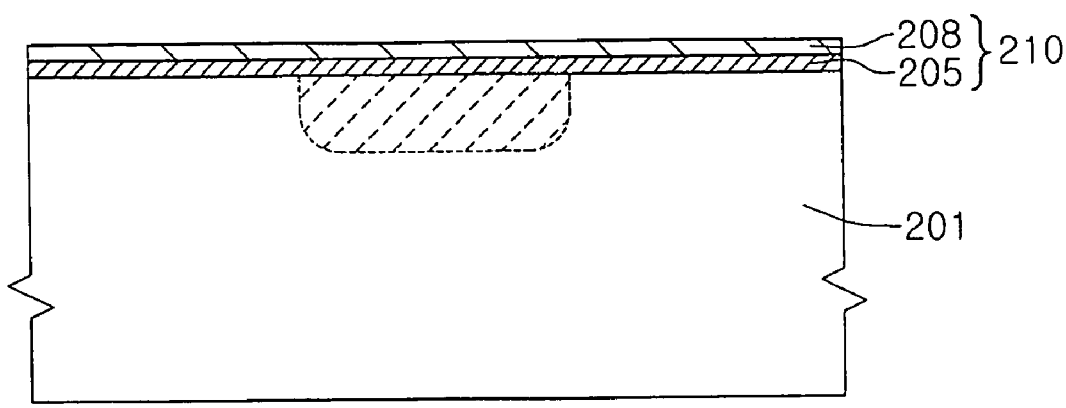

After completing the second annealing, a tunnel oxide film 208 is formed on the gate oxide film 205, as shown in FIG. 2*c,* thereby providing a gate insulating film 210 consisting of the gate oxide film 205 and the tunnel oxide film 208. Preferably, the tunnel oxide film has a thickness of 50 to 100 Å.

The gate insulating film is left only on the gate insulating film forming region by selectively patterning the gate oxide film and the tunnel oxide film. Subsequent processes of the method of manufacturing the EEPROM may be similar to conventional manufacturing processes.

The difference between one case where the tunnel oxide film is grown after performing the second ion implantation and the annealing and another case where the tunnel oxide film is grown without annealing after performing the second ion implantation, is described in greater detail below.

Figure 3:
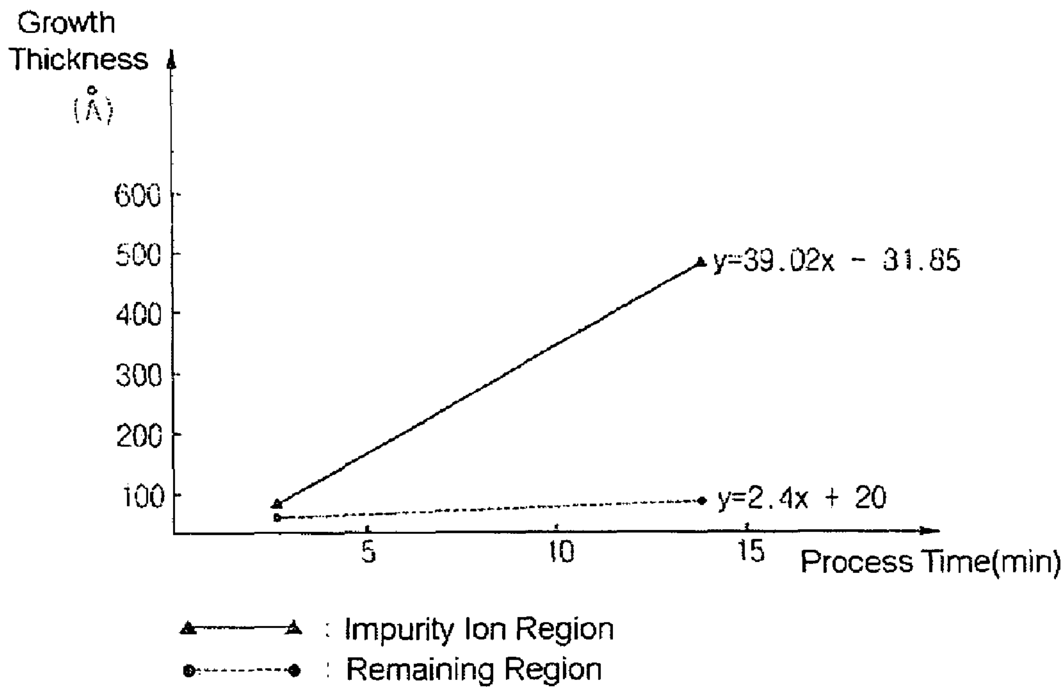
FIG. 3 is an example graph depicting a difference of growth speed of tunnel oxide films in an impurity-doped region and the remainder region, respectively, when the tunnel oxide film is grown without annealing after performing a second ion implantation.
Figure 4:
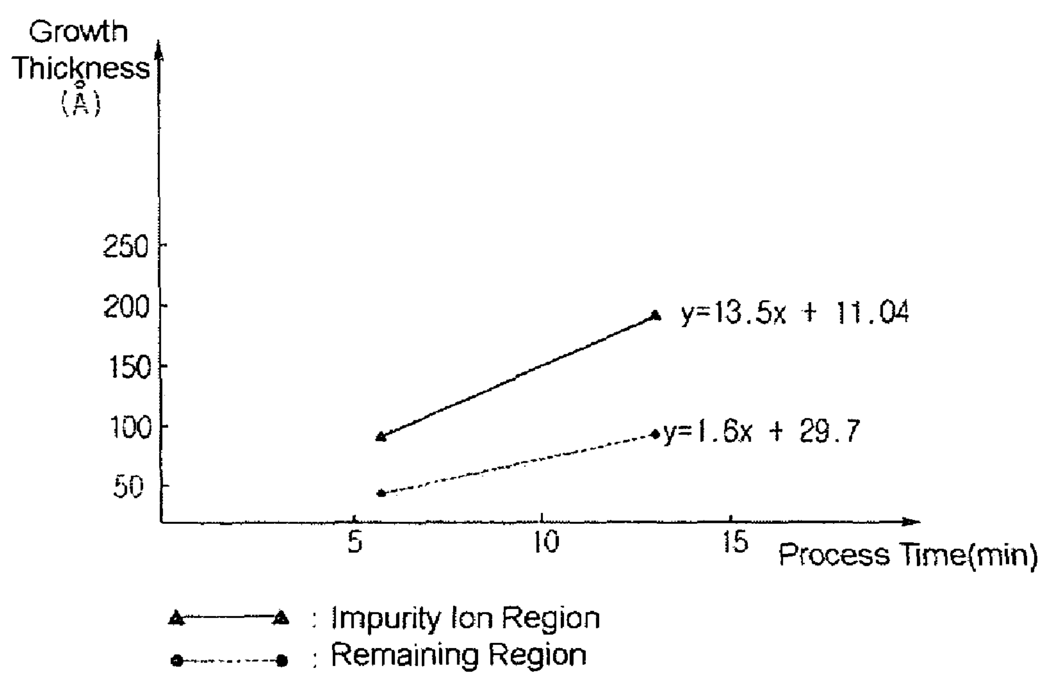
FIG. 4 is an example graph depicting a difference of growth speed of tunnel oxide films in an impurity-doped region and the remainder region, respectively, when the tunnel oxide film is grown after performing a second ion implantation and annealing.

Tables 3 and 4 and FIGS. 3 and 4 indicate example growth of the tunnel oxide film according to whether or not the annealing is carried out after performing the second ion implantation, respectively. For reference, the process conditions for the formation of the tunnel oxide film after carrying out the annealing or not were the same.

As indicated in Table 3 and FIG. 3, in the case of forming the tunnel oxide film without performing the annealing, the growth speed of the tunnel oxide film in the region doped with impurity ions is remarkably different from that of the region not doped with impurity ions.

TABLE 3

| | Growth Thickness(Å) | Process Time(Min) |
|---|---|---|
| Impurity ion region | 455.9 | 12.5 |
| Remaining region | 50 | 12.5 |

As indicated in Table 4 and FIG. 4, in the case of forming the tunnel oxide film after performing the annealing, the growth speed of the tunnel oxide film in the region doped with impurity ions is slightly different from that of the region not doped with impurity ions. In other words, the difference is reduced as compared with one case where the annealing was carried out and the other case where the annealing was not carried out.

TABLE 4

| | Growth Thickness(Å) | Process Time(Min) |
|---|---|---|
| Impurity ion region | 180.3 | 12.5 |
| Remaining region | 50 | 12.5 |

With the above-described example method, in the growth of the gate oxide film and the tunnel oxide film by performing ion implantation defining a junction region, i.e., independently performing the first ion implantation of 31P ions and the second ion implantation of 75As ions and then forming a gate oxide film and a tunnel oxide film, the growth of the oxide films may be carried out at the same speed, regardless of whether impurity ions are implanted in the semiconductor substrate. As a result, a difference of height is not induced at the formation of device patterns such as a floating gate, a control gate or the like, thereby improving the reliability of the device.

Although certain methods and apparatus have been described herein, the scope of coverage of this patent is not limited thereto. To the contrary, this patent covers all embodiments fairly falling within the scope of the appended claims either literally or under the doctrine of equivalents.

What is claimed is:

1. A method of manufacturing an EEPROM device, comprising:

forming a screen oxide film on a semiconductor substrate;

forming a first ion implantation mask defining a gate insulating film forming region on the screen oxide film;

performing a first ion implantation on the semiconductor substrate and the first ion implantation mask;

performing a first annealing of the semiconductor substrate;

removing the screen oxide film and the first ion implantation mask;

forming a gate oxide film on the semiconductor substrate;

forming a second ion implantation mask defining a gate insulating film forming region on the gate oxide film;

performing a second ion implantation on the semiconductor substrate and the second ion implantation mask;

performing a second annealing for the semiconductor substrate;

removing the second ion implantation mask; and forming a tunnel oxide film on the gate oxide film.

2. The method of claim 1, wherein the gate oxide film has a thickness of 50 to 300 Å.

3. The method of claim 1, wherein the tunnel oxide film has a thickness of 50 to 100 Å.

4. The method of claim 1, wherein the first annealing is performed at a temperature of 1000 to 1050° C. for 10 to 20 seconds.

5. The method of claim 1, wherein the second annealing is performed at a temperature of 1050 to 1150° C. for 10 to 20 seconds.

6. The method of claim 1, wherein the first ion implantation is performed by implanting 31P ions with an ion implantation energy of 50 to 70 KeV and dose of $2\times10^{13}$ to $2\times10^{14}$ ion/cm$^2$.

7. The method of claim 1, wherein the second ion implantation is performed by implanting 75As ions with an ion implantation energy of 60 to 85 KeV and dose of $1\times10^{14}$ to $1\times10^{15}$ ion/cm$^2$.

8. The method of claim 1, wherein the screen oxide film has a thickness of 40 to 60 Å.

* * * * *